(12) United States Patent
Marsh et al.

(10) Patent No.: US 6,632,684 B2
(45) Date of Patent: Oct. 14, 2003

(54) METHOD OF MANUFACTURING OPTICAL DEVICES AND RELATED IMPROVEMENTS

(75) Inventors: John Haig Marsh, Glasgow (GB); Craig James Hamilton, Ralston, Renfrewshire (GB); Stuart Duncan McDougall, Hazelbank, Lanark (GB); Olek Peter Kowalski, Paisley (GB)

(73) Assignee: The University Court of The University of Glasgow (GB)

( * ) Notice: Subject to any disclaimer, the term of this patent is extended or adjusted under 35 U.S.C. 154(b) by 20 days.

(21) Appl. No.: 09/788,975

(22) Filed: Feb. 20, 2001

(65) Prior Publication Data

US 2002/0137251 A1 Sep. 26, 2002

(30) Foreign Application Priority Data

Feb. 1, 2001 (GB) .............................................. 0102536

(51) Int. Cl.[7] .............................................. H01L 21/00
(52) U.S. Cl. ................................ 438/7; 438/31; 438/94
(58) Field of Search ................................ 438/7, 31, 32, 438/36, 94, 96, 97

(56) References Cited

U.S. PATENT DOCUMENTS

| | | | |
|---|---|---|---|
| 4,282,494 A | 8/1981 | Yonezu et al. | 372/46 |
| 4,511,408 A | 4/1985 | Holonyak, Jr. | 438/36 |
| 4,585,491 A | 4/1986 | Burnham et al. | 438/7 |
| 4,594,603 A | 6/1986 | Holonyak, Jr. | 257/15 |
| 4,639,275 A | 1/1987 | Holonyak, Jr. | 438/36 |
| 4,727,556 A | 2/1988 | Burnham et al. | 372/50 |
| 4,845,216 A | 7/1989 | Taylor et al. | 544/279 |
| 4,845,727 A | 7/1989 | Murray | 377/43 |
| 4,857,971 A | 8/1989 | Burnham | 372/45 |
| 4,871,690 A | 10/1989 | Holonyak, Jr. et al. | 438/36 |
| 5,384,797 A | 1/1995 | Welch et al. | 372/23 |
| 5,701,325 A | * 12/1997 | Ouchi et al. | 438/32 |
| 5,879,519 A | 3/1999 | Seeser et al. | 204/192.12 |
| 6,043,427 A | * 3/2000 | Nishimoto | 438/96 |

OTHER PUBLICATIONS

McIlvaney et al., "Far–field behaviour of 980 nm broad area lasers incorporating bandgap widened extended slab waveguides", Oct. 26, 1994, IEEE (1995).

Qian et al., "Three Band–gap QW Intermixing in InP/InGaAs/InGaAsP System for Monolithically Integrated Optical Switch", IEEE 1998, pp. 194–195.

Marsh et al., "Quantum well intermixing in material systems for 1.5 um (invited)", J. Vac. Sci. Technol. A, vol. 16, No. 2, pp. 810–816, Mar./Apr. 1998.

Camacho et al., "Laser structure for generating high optical power in a singlemode waveguide", Electronics Letters, vol. 34, No. 5, pp. 460–461, Mar. 5, 1998.

Hamilton et al., "Bandgap tuning of visible laser material", Mar. 5, 1998, Electronics Letters, vol. 34, No. 7, pp. 665–666, Apr. 2, 1998.

(List continued on next page.)

*Primary Examiner*—Chandra Chaudhari
(74) *Attorney, Agent, or Firm*—Piper Rudnick; Jefferson Perkins

(57) ABSTRACT

There is disclosed an improved method of manufacturing of an optical device (40), particularly semiconductor optoelectronic devices such as laser diodes, optical modulators, optical amplifiers, optical switches, and optical detectors. The invention provides a method of manufacturing optical device (40), a device body portion (15) from which the device (40) is to be made including a Quantum Well (QW) structure (30), the method including the step of: processing the device body portion (15) so as to create extended defects at least in a portion (53) of the device portion (5). Each extended defect is a structural defect comprising a plurality of adjacent "point" defects.

22 Claims, 7 Drawing Sheets

OTHER PUBLICATIONS

Kowalski et al., "Fabrication of narrow far–field InGaAs–InAlGaAs broad–area lasers using quantum well intermixed extended cavities", CLEO, Monday Morning, May 4, 1998, pp. 37–38.

Carpenter et al., "SIMS analysis of InGaAs/InAlGaAs wafers—Report No. SI/GLU/6725", Institute of Surface Science and Technology, Loughborough University, Apr. 27, 1998, 26 pgs.

Marsh et al., "Monolithic integration in III–V semiconductors via a universal damage enhanced quantum well intermixing technique", Part of the SPIE Conference on Materials Modification by Ion Irradiation, Quebec, Canada, Jul. 1998, SPIE vol. 3413, 9 pgs.

Saher, Helmy A., "Micro Raman studies of disordering due to dielectric cap annealing in GaAs/AlGaAs heterostructures; A Progress Report", May 5, 1998, 23 pgs.

McDougall et al., "Monolithic Integration via a Universal Damage Enhanced Quantum–Well Intermixing Technique", IEEE Journal of Selected Topics in Quantum Electronics, vol. 4, No. 4, Jul./Aug. 1998.

Helmy et al., "Quantitative Model for the Kinetics of Compositional Intermixing in GaAs–AlGaAs Quantum–Confined Heterostructures", IEEE Journal of Selected Topics in Quantum Electronics, vol. 4, No. 4, pp. 653–660, Jul./Aug. 1998.

Ke et al., "The electronic structure and optical properties of intermixed GaAs/AlGaAs double quantum wells", Journal of Applied Physics, vol. 84, No. 5, pp. 2855–2857, Sep. 1, 1998.

Li et al., "Silica capping for Al 0.3Ga 0.7 As/GaAs and In0.2Ga0.8As/GaAs quantum well intermixing", Applied Physics Letters, vol. 73, No. 23, pp. 3393–3395, Dec. 7, 1998.

Helmy et al., "Control of silica cap properties by oxygen plasma treatment for single–cap selective impurity free vacancy disordering", Applied Physics Letters, vol. 74, No. 5, pp. 732–734, Feb. 1, 1999.

McDougall et al., "GaAs/AlGaAs waveguide pin photodiodes with non–absorbing input facets fabricated by quantum well intermixing", Electronics Letters, vol. 36, No. 8, pp. 749–750, Apr. 13, 2000.

Liu et al., "Fabrication of Monolithically Integrated Mach–Zender Asymmetric Interferometer Switch", IEEE 2000, pp. 412–414.

"A13764 Al–quat MQW structure: Intermixing PL shifts recorded for control sample sputterred on week 1 and annealed each week", 4 pgs. (no date).

"Intermixing Process control meeting: Effect of change of control TC from edge to centre", 1 pg.; Apr. 6, 2000.

Qui et al., "Monolithically Integrated Fabrication of 2×2 and 4×4 Crosspoint Switches Using Quantum Well Intermixing", pp. 415–418, IEEE 2000.

Ke et al., "Monolithically integrated distributed Bragg reflector lasers for 1.5 um operation with band gap shifted grating section", Optical Materials 14 (2000), pp. 193–196.

McDougall et al., "Harmonic modelocking at up to 440GHz repetition rates in InGaAs–InAlGaAs quantum well lasers", Department of Electronics and Electrical Engineering, University of Glasgow (no date).

Kowalski et al., " Monolithic integration in InGaAs–InAlGaAs optoelectronic devices for 1.55 um emission by quantum well intermixing", Department of Electronics and Electrical Engineering, University of Glasgow (no date).

Liu et al., "Control of Multiple Bandgap shifts in InGaAs–AlInGaAs Multiple–quantum–Well Material using different thicknesses of PECVD SiO2 protection layers", IEEE Photonics Technology Letters, vol. 12, No. 9, pp. 1141–1143, Sep. 2000.

Qui et al., "Precise control of the Blue–shift of the wavelength in InGaAs–InGaAsP Multiple quantum wells using a sputtered SiO2 technique", LEOS' 99 IEEE Lasers and Electro–Optics Society, 1999 12th Annual Meeting, vol. 1, pp. 309–310, 1999.

McDougall et al., "Monolithic Integration via a Universal Damage Enhanced Quantum–Well Intermixing Technique", IEEE Journal of Selected Topics in Quantum Electronics, vol. 4, No. 4, pp. 636–646, Jul./Aug. 1998.

Qui et al., "Monolithically Integrated Fabrication of 2×2 and 4×4 Crosspoint Switches Using Quantum Well Intermixing", IEEE International Conference on Indium Phosphide and Related Materials, 2000 Conference Proceedings, 2000, pp. 415–418.

Kowalski et al., "A universal damage induced technique for quantum well intermixing", Applied Physics Letters, vol. 72, No. 5, Feb. 2, 1998, pp. 581–583.

Qui et al., "Extended cavity lasers in InGaAs–InGaAsP and InGaAlP–GaAs multi–quantum well structure using a sputtered SiO2 Technique", IEEE 10th International Conference on Indium Phosphide and Related Materials, May 11–15, 1998, pp. 635–638.

* cited by examiner

Excellent alignment of active and passive waveguides
Reflective coefficient can be negligible (~10⁻⁶)
Mode matching is intrinsic to the process
p-i-n structure can lead to losses in passive waveguide

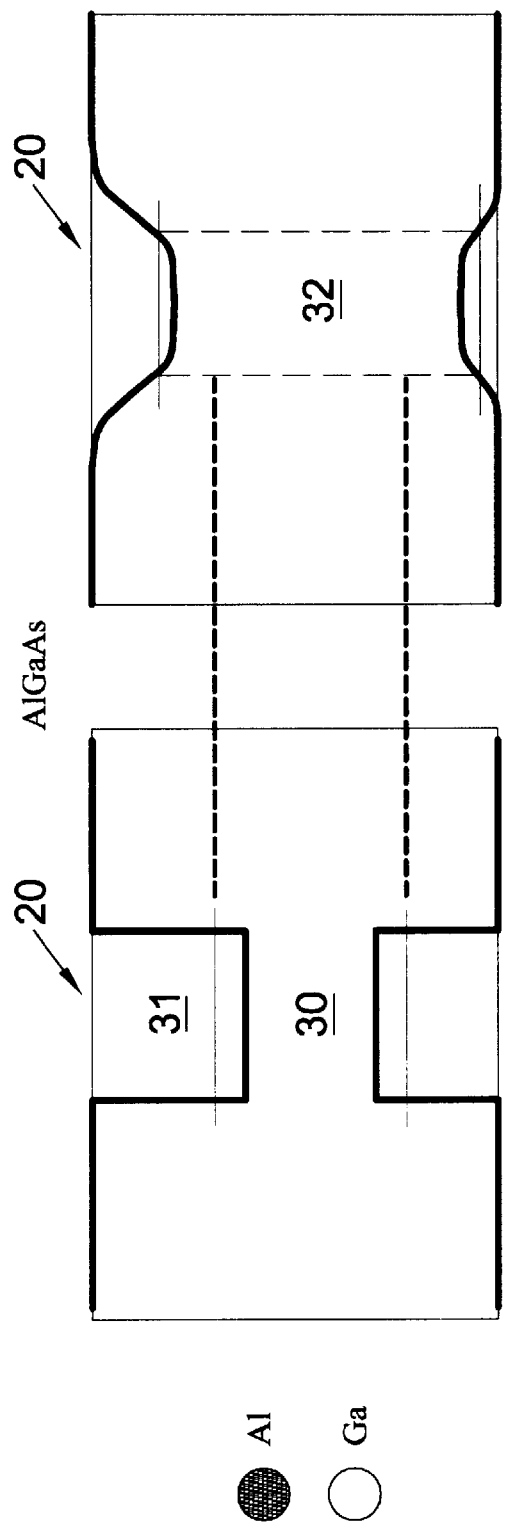

METHOD OF MANUFACTURING OPTICAL DEVICES AND RELATED IMPROVEMENTS

CROSS REFERENCE TO RELATED APPLICATIONS

This application is related to the application entitled "Method of Manufacturing Optical Devices and Related Improvements", submitted on the same date of Feb. 20, 2001 (Ser. No. 09/789,240). The disclosure of that application is fully incorporated by reference herein.

FIELD OF INVENTION

This invention relates to a method of manufacturing of optical devices, and in particular, though not exclusively, to manufacturing integrated optical devices or optoelectronic devices, for example, semiconductor optoelectronic devices such as laser diodes, optical modulators, optical amplifiers, optical switches, optical detectors, and the like. The invention further relates to Optoelectronic Integrated Circuits (OEICs) and Photonic Integrated Circuits (PICs) including such devices.

BACKGROUND TO INVENTION

Quantum Well Intermixing (QWI) is a process which has been reported as providing a possible route to monolithic optoelectronic integration. QWI may be performed in III–V semiconductor materials, eg Aluminium Gallium Arsenide (AlGaAs) and Indium Gallium Arsenide Phosphide (InGaAsP), which may be grown on binary substrates, eg Gallium Arsenide (GaAs) or Indium Phosphide (InP). QWI alters the band-gap of an as-grown structure through inter-diffusion of elements of a Quantum Well (QW) and associated barriers to produce an alloy of the constituent components. The alloy has a band-gap which is larger than that of the as-grown QW. Any optical radiation (light) generated within the QW where no QWI has taken place can therefore pass through a QWI or "intermixed" region of alloy which is effectively transparent to the said optical radiation.

Various QWI techniques have been reported in the literature. For example, QWI can be performed by high temperature diffusion of elements such as Zinc into a semiconductor material including a QW.

QWI can also be performed by implantation of elements such as silicon into a QW semiconductor material. In such a technique the implantation element introduces point defects in the structure of the semiconductor material which are moved through the semiconductor material inducing intermixing in the QW structure by a high temperature annealing step.

Such QWI techniques have been reported in "Applications of Neutral Impurity Disordering in Fabricating Low-Loss Optical Waveguides and Integrated Waveguide Devices", Marsh et al, Optical and Quantum Electronics, 23, 1991, s941–s957, the content of which is incorporated herein by reference.

A problem exists with such techniques in that although the QWI will alter (increase) the band-gap of the semiconductor material post-growth, residual diffusion or implantation dopants can introduce large losses due to the free carrier absorption coefficient of these dopant elements.

A further reported QWI technique providing intermixing is Impurity Free Vacancy Diffusion (IFVD). When performing IFVD the top cap layer of the III–V semiconductor structure is typically GaAs or Indium Gallium Arsenide (InGaAs). Upon the top layer is deposited a silica ($SiO_2$) film. Subsequent rapid thermal annealing of the semiconductor material causes bonds to break within the semiconductor alloy and Gallium ions or atoms—which are susceptible to silica ($SiO_2$)—to dissolve into the silica so as to leave vacancies in the cap layer. The vacancies then diffuse through the semiconductor structure inducing layer intermixing, eg in the QW structure.

IFVD has been reported in "Quantitative Model for the Kinetics of Compositional Intermixing in GaAs—AlGaAs Quantum—Confined Heterostructures", by Helmy et al, IEEE Journal of Selected Topics in Quantum Electronics, Vol 4, No 4, July/August 1998, pp 653–660, the content of which is incorporated herein by reference.

Reported QWI, and particularly IFVD methods, suffer from a number of disadvantages, eg the temperature at which Gallium out-diffuses from the semiconductor material to the silica ($SiO_2$) film.

It is an object of at least one aspect of the present invention to obviate or at least mitigate at least one of the aforementioned disadvantages/problems in the prior art.

It is also an object of at least one aspect of the present invention to provide an improved method of manufacturing an optical device using an improved QWI process.

SUMMARY OF INVENTION

According to a first aspect of the present invention, there is provided a method of manufacturing an optical device, a device body portion from which the device is to be made including a Quantum Well (QW) structure, the method including the step of:

processing the device body portion so as to create extended defects at least in a portion of the device portion.

Each extended defect may be understood to be a structural defect comprising a plurality of adjacent "point" defects.

Preferably said step of processing the device body portion comprises sputtering from the device body portion.

In said step of sputtering from the device body portion a magnetic field may be provided around the device body portion.

In said step of sputtering from the device body portion, a magnetron sputterer may be used.

In said step of sputtering from the device body portion a (reverse) electrical bias may be applied across an electrode upon which the device body portion is provided so as to provide a "pre-etch" or cleansing of the device body portion.

In a preceding implementation the method may include the preferred step of depositing a dielectric layer on at least one other portion of the device body portion.

The dielectric layer may therefore act as a mask in defining the at least one portion.

The method may also include the subsequent step of depositing a further dielectric layer on the dielectric layer and/or on the at least one portion of the device body portion.

Advantageously the dielectric layer and/or the further dielectric layer may be deposited by use of a magnetron sputterer. Alternatively, the dielectric layer and/or the further dielectric layer may be deposited by a deposition technique other than by use of a diode sputterer, eg Plasma Enhanced Chemical Vapour Deposition (PECVD). By either of these deposition techniques low damage dielectric layer(s) is/are provided which do not substantially affect an adjacent portion of the device body portion.

The dielectric layer(s) may beneficially substantially comprise silica ($SiO_2$); or may comprise another dielectric material such as Aluminium Oxide ($Al_2O_3$).

Preferably, the sputterer includes a chamber which may be substantially filled with an inert gas such as Argon, preferably at a pressure of around 2 µm of Hg, or a mixture of Argon and Oxygen, eg in the proportion 90%/10%.

The step(s) of depositing the dielectric layer(s) may comprise part of a Quantum Well Intermixing (QWI) process used in manufacture of the device.

The QWI process may comprise Impurity-Free Vacancy Disordering (IFVD)

Preferably, the method of manufacture also includes the subsequent step of annealing the device body portion including the dielectric layer at an elevated temperature.

It has been surprisingly found that by sputtering from the device body portion as a step in a QWI technique such as IFVD, preferably by use of a magnetron sputterer, damage induced extended defects are introduced into the at least one portion of the device body portion; the at least one portion may, for example, comprise at least a part of a top or "capping" layer. It is believed that the damage arises due to breakage of bonds in the capping layer before annealing, eg the application of thermal energy by rapid thermal annealing, thereby inhibiting transfer of Gallium from the at least one portion, eg into the further dielectric layer.

Preferably the method of manufacture also includes the preceding steps of:

providing a substrate;
growing on the substrate:
a first optical cladding layer;
a core guiding layer including a Quantum Well (QW) structure; and
a second optical cladding layer.

The first optical cladding layer, core guiding layer, and second optical cladding layer may be grown by Molecular Beam Epitaxy (MBE) or Metal Organic Chemical Vapour Deposition (MOCVD).

In a preferred embodiment the method may comprise the step of:

depositing the dielectric layer on a surface of the device body portion;
defining a pattern in photoresist on a surface of the dielectric layer and lifting off at least part of the photoresist so as to provide the dielectric layer on said at least one other portion of the device body portion.

In said preferred embodiment, the method may also include the step of:

depositing the further dielectric layer on a portion of the surface of the device body and on a surface of the dielectric layer prior to annealing.

In said preferred embodiment, the dielectric layer may comprise an intermixing cap; while the at least one portion of the device body portion and/or the further dielectric layer may comprise an intermixing suppressing cap.

The thickness of the dielectric layer(s) may be around 10 to a few hundred nm.

A subsequent annealing step may occur at a temperature of around 700° C. to 1000° C. for around 0.5 to 5 minutes, and in one embodiment at substantially 800° C. for around 1 minute.

According to a second aspect of the present invention there is provided a method of manufacturing an optical device, a device body portion from which the device is to be made including a Quantum Well (QW) structure, the method including the step of:

sputtering from the device body portion.

Preferably the step of sputtering from the device body portion is carried out using a magnetron sputterer.

According to a third aspect of the present invention there is provided an optical device fabricated from a method according to either of the first or second aspects of the present invention.

The optical device may be an integrated optical device or an optoelectronic device.

The device body portion may be fabricated in a III–V semiconductor materials system.

In a most preferred embodiment the III–V semiconductor materials system may be a Gallium Arsenide (GaAs) based system, and may operate at a wavelength(s) of substantially between 600 and 1300 nm. Alternatively, in a less preferred embodiment the III–V semiconductor materials system may be an Indium Phosphide based system, and may operate at a wavelength(s) of substantially between 1200 and 1700 nm. The device body portion may be made at least partly from Aluminium Gallium Arsenide (AlGaAs), Indium Gallium Arsenide (InGaAs), Indium Gallium Arsenide Phosphide (InGaAsP), Indium Gallium Aluminium Arsenide (InGaAlAs) and/or Indium Gallium Aluminium Phosphide (InGaAlP).

The device body portion may comprise a substrate upon which are provided a first optical cladding layer, a core guiding layer, and a second optical cladding layer.

Preferably the Quantum Well (QW) structure is provided within the core guiding layer.

The core guiding layer, as grown, may have a smaller band-gap and higher refractive index than the first and second optical cladding layers.

According to a fourth aspect of the present invention there is provided an optical integrated circuit, optoelectronic integrated circuit (OEIC), or photonic integrated circuit (PIC) including at least one optical device according to the third aspect of the present invention.

According to a fifth aspect of the present invention there is provided a device body portion ("sample") when used in a method according to either the first or the second aspects of the present invention.

According to a sixth aspect of the present invention there is provided a wafer of material including at least one device body portion when used in a method according to either of the first or second aspects of the present invention.

According to a seventh aspect of the present invention there is provided a sputtering apparatus when used in a method according to the second aspect of the present invention.

Preferably the sputtering apparatus is a magnetron sputterer.

According to an eighth aspect of the present invention there is provided use of a sputtering apparatus in a method according to either of the first or second aspects of the present invention.

BRIEF DESCRIPTION OF DRAWINGS

Embodiments of the present invention will now be described, by way of example only, and with reference to the accompanying drawings, which are:

FIG. 3 a schematic view of band-gap energies of a part of the device body portion of FIG. 1 the part comprising a core layer including a Quantum Well (QW) therein;

FIG. 4 a schematic view similar to FIG. 3 of band-gap energies of a corresponding part of the optical device of FIG. 2 when Quantum Well Intermixed (QWI);

DETAILED DESCRIPTION OF DRAWINGS

Figure 1:
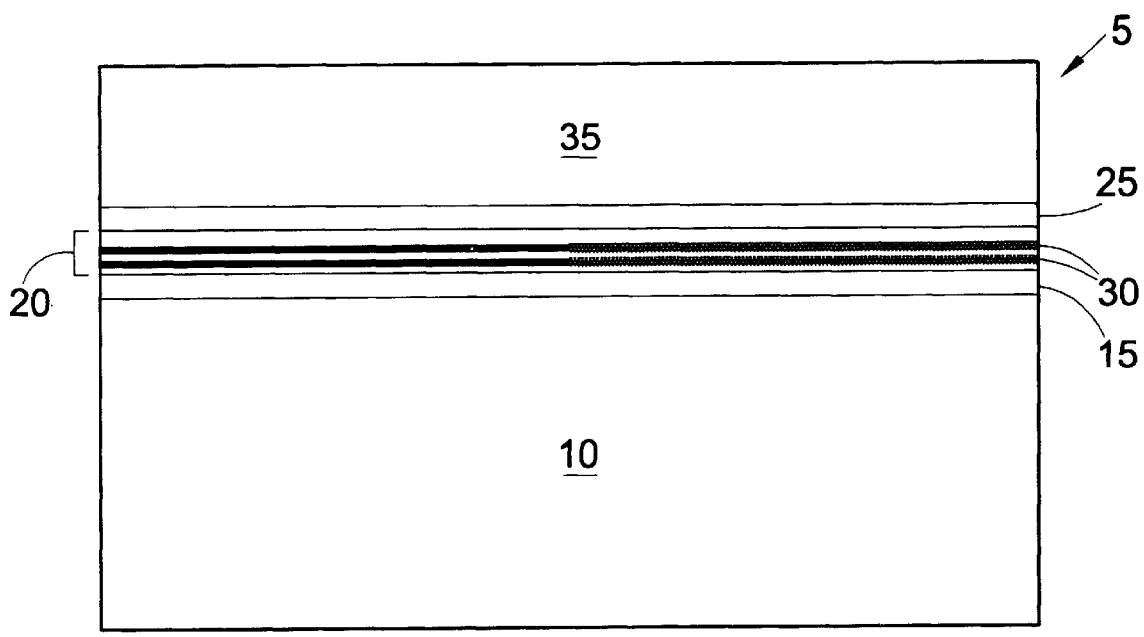
FIG. 1 a side view of a device body portion, as grown, for use in a method of manufacture of an optical device according to an embodiment of the present invention.

Referring initially to FIG. 1, there is shown a device body portion, generally designated 5, as grown, for use in a method of manufacture of an optical device according to a first embodiment of the present invention. The optical device is an integrated optical device or an optoelectronic device.

The device body portion 5 is suitably fabricated in a III–V semiconductor material system, most preferably such as Gallium Arsenide (GaAs), and operating at a wavelength(s) of substantially between 600 and 1300 nm, or alternatively, though less preferably, Indium Phosphide (InP), and operating at a wavelength(s) of substantially between 1200 and 1700 nm. The device body portion 5 may be made at least partly from Aluminium Gallium Arsenide (AlGaAs), Indium Gallium Arsenide (InGaAs), Indium Gallium Arsenide Phosphide (InGaAsP), Indium Aluminium Gallium Arsenide (InGaAlsAs) and/or Indium Gallium Aluminium Phosphide (InGaAlP). In this described first embodiment, the device body portion is made from AlGaAs.

The device body portion 5 may form part of a semiconductor wafer (see FIG. 6) together with a plurality of other possibly like optical devices which may be cleaved from the wafer after processing. The device body portion 5 comprises substrate 10 upon which is provided a first optical cladding layer 15, a core guiding layer 20, and a second optical cladding layer 25. A Quantum Well (QW) structure 30, including at least one Quantum Well, is provided within the core guiding layer 20, as grown. On the second optical cladding layer 30 there is provided a capping layer 35.

As will be appreciated, the core guiding layer 20, as grown, has a smaller band-gap and higher refractive index than the first and second optical cladding layer 15,25.

Figure 2:
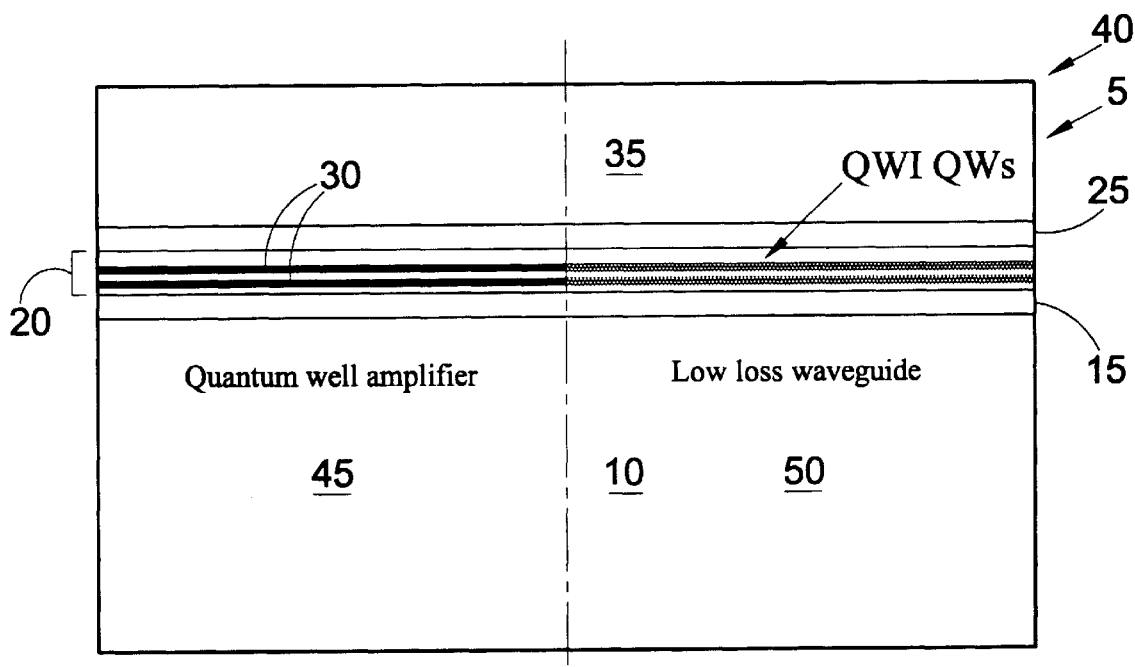
FIG. 2 a side view of an optical device according to an embodiment of the present invention manufactured from the device body portion of FIG. 1.

Referring now to FIG. 2, there is shown an optical device, generally designated 40, manufactured from the device body portion 5 of FIG. 1, by a method which will be described in detail hereinafter. As can be seen from FIG. 2, the device 40 comprises an active region 45 and a passive region 50. In this embodiment the active region 45 comprises a Quantum Well (QW) amplifier. However, it should be understood that the active region 45 may in other embodiments, comprise a laser, modulator, switch, detector or like active (electrically controlled) optical device. Further, the passive region 50 comprises a low-loss waveguide wherein the Quantum Well structure 30 has been at least partially removed by a Quantum Well Intermixing (QWI) technique, as will hereinafter be described in greater detail.

The device 40 has excellent alignment between the core layer 20 waveguiding regions of the active region 45 and passive region 50, and has a reflection coefficient between the active region 45 and passive region 50 which is substantially negligible (of the order of $10^{-6}$). Further, mode matching between the active region 45 and the passive region 50 is intrinsic to the device 40.

Typically, the substrate 10 is n-type doped to a first concentration, while the first cladding layer 15 is n-type doped to a second concentration. Further, the core layer 20 is typically substantially intrinsic, while the second cladding layer 25 is typically p-type doped to a third concentration. Further, the cap layer (or contact layer) 35 is p-type doped to a fourth concentration. It will be appreciated by those skilled in the art, that the cap layer 35 and second cladding layer 25 may be etched into a ridge (not shown), the ridge acting as an optical waveguide to confine optical modes within the core layer 20, both within the optically active region 45 and the optically passive region 50. Further, contact metallisations (not shown) may be formed on at least a portion of a top surface of the ridge within the optically active region 45, and also on an opposing surface of the substrate 10, as is known in the art.

It will further be appreciated that the device 40 may comprise part of an optical integrated circuit, optoelectronic integrated circuit (OEIC), or photonic integrated circuit (PIC) which may comprise one or more of such optical devices 40.

Referring now to FIG. 3, there is shown a schematic representation of the band-gap energies of a Quantum Well 31 of the Quantum Well structure 30 within the core layer 20 of the device body portion 5, as grown. As can be seen from FIG. 3, the AlGaAs core layer 20 includes at least one Quantum Well 31, with the Quantum Well structure 30 having a lower Aluminium content than the surrounding core layer 20, such that the band-gap energy of the Quantum Well structure 30 is less than that of the surrounding AlGaAs core layer 20. The Quantum Well structure 30 is typically around 3 to 20 nm thick, and more typically around 10 nm in thickness.

Referring now to FIG. 4, there is shown a corresponding portion 32 of the core layer 20 as in FIG. 3, but which has been Quantum Well Intermixed (QWI) so as to effectively increase the band-gap energy (meV) of the part 32 which corresponds to the Quantum Well 31 of the Quantum Well structure 30. Quantum Well Intermixing (QWI) therefore essentially "washes out" the Quantum Well structure 30 from the core layer 20. The portion shown in FIG. 4 relates to the passive region 50 of the device 40. As will be understood, optical radiation transmitted from or generated within the optically active region 45 of device 40 will be transmitted through the low loss waveguide provided by the Quantum Well Intermixed (QWI) region 32 of the core layer 20 of the passive region 50.

Figure 5A:
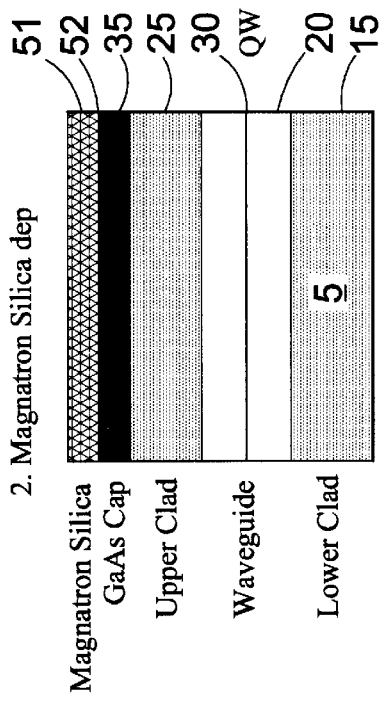
FIGS. 5(a) to (g) a series of schematic side views of a device body portion during various steps of a method of manufacture of the optical device of FIG. 2.
Figure 5B:
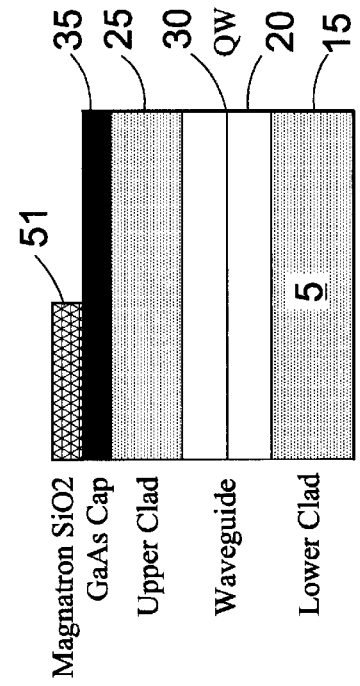
Figure 5C:
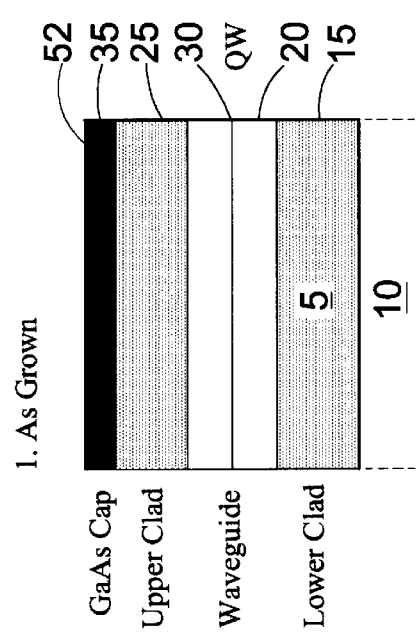
Figure 5D:
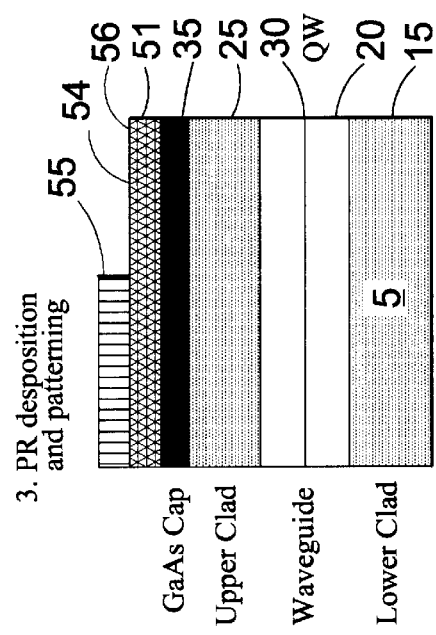
Figure 5E:
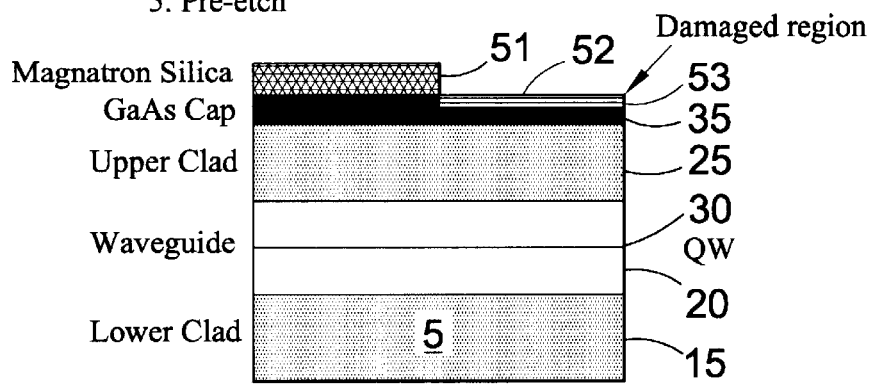

Referring now to FIGS. 5(a) to (g), there is illustrated a first embodiment of a method of manufacturing an optical device 40 from a device body portion 5, including a Quantum Well (QW) structure 30 according to the present invention, the method including the steps (see FIGS. 5(d) to (e)) of processing the device body portion 5 so as to create extended defects at least in a portion 53 of the device body portion 5.

The method of manufacture begins (see FIG. 5(a)) with the step of:

providing substrate 10, growing on the substrate 10 first optical cladding layer 15, core guiding layer 20 including at least one Quantum Well (QW) 30, second optical cladding layer 25, and cap layer 35.

The first optical cladding layer 15, core guiding layer 20, second optical cladding layer 25, and cap layer 35 may be grown by known semiconductor epitaxial growth techniques such as Molecular Beam Epitaxy (MBE) or Metal Organic Chemical Vapour Deposition (MOCVD).

Once the device of body 5 has been grown—normally as part of a wafer (not shown) including a plurality of such device body portions 5, a dielectric layer 51 is deposited on a surface 52 of the cap layer 35 (see FIG. 5(b). A pattern is then defined in Photoresist (PR) 55 on a surface 54 of the dielectric layer 51. The Photoresist 55 is then lifted off so as to leave at least one portion 56 of the dielectric layer 51 exposed (see FIG. 5(c)).

Referring to FIG. 5(d), the Photoresist 55 and at the least one portion 56 of the dielectric layer 51 are then removed by known etching techniques, eg wet or dry etching. In the case of wet etching Hydrofloric (HF) acid may be employed.

Referring to FIG. 5(e), the device body portion 5 is processed so as to create extended defects at least in a portion 53 of the device body portion 5. The step of processing the device body portion 5 comprises sputtering from the device body portion 5 using a magnetron sputterer 65 as will hereinafter be described in greater detail. This step may be referred to as a "pre-etch", and involves reversing the electrical bias voltages of the sputterer 65.

Figure 5F:
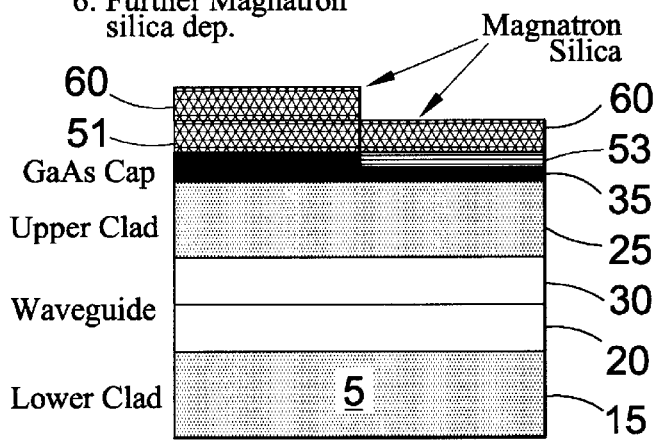

Referring to FIG. 5(f), a further dielectric layer 60 is then deposited on the dielectric layer 51 and on the at least one portion 53 of the device body portion 5.

The dielectric layer 51 and further dielectric layer 60 are deposited by use of the magnetron sputterer 65. In a modification the dielectric layer 51 and/or the further dielectric layer 60 may be deposited by a deposition technique other than by the use of a diode sputterer, eg Plasma Enhanced Chemical Vapour Disposition (PECVD).

Figure 6:
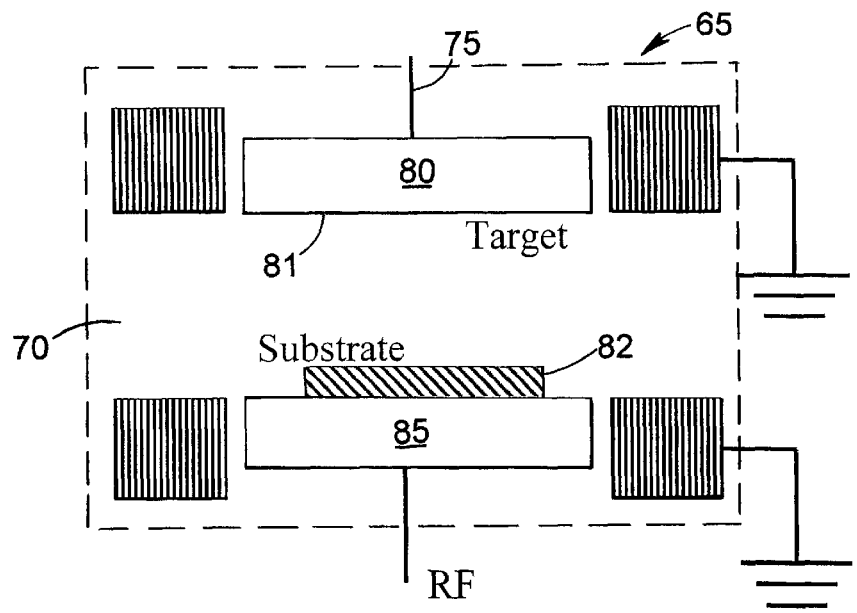
FIG. 6 a simplified schematic representation of a magnetron sputterer apparatus for use in the method of manufacturing Figures (a) to (g)
Figure 7:
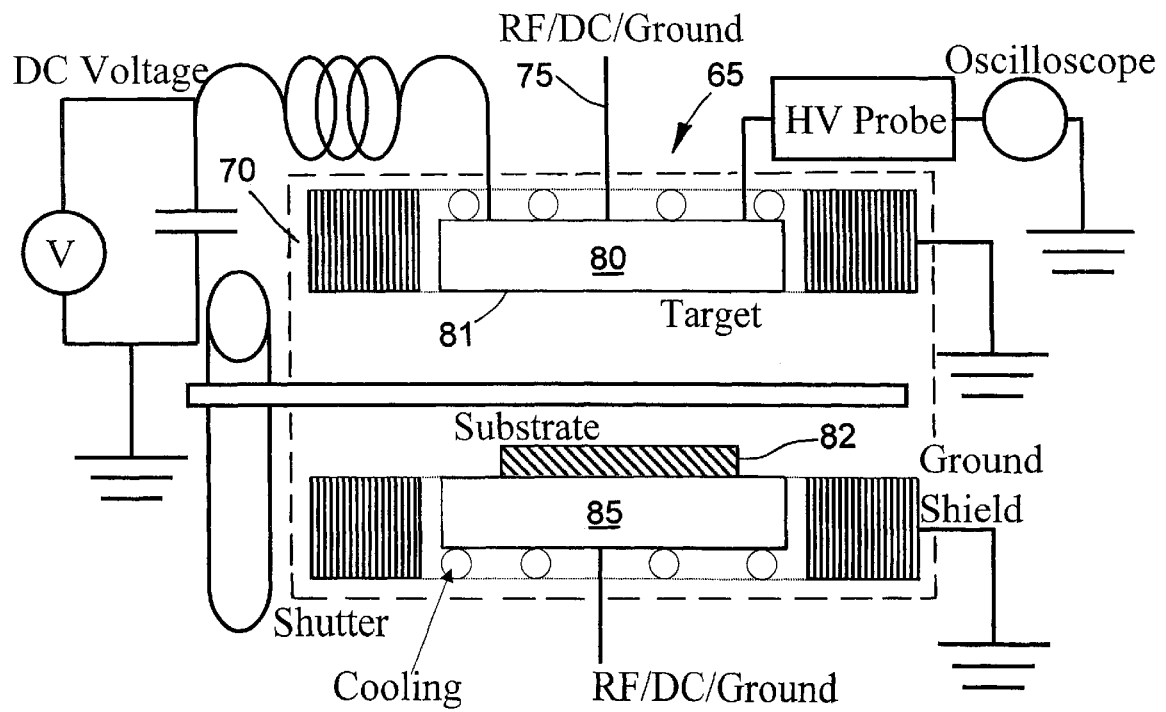
FIG. 7 a more detailed schematic representation of the magnetron sputterer FIG. 6.

Referring briefly to FIGS. 6 and 7, the dielectric layer 51 is deposited by sputtering, and in this embodiment the dielectric layer 51 is deposited by sputtering using a magnetron sputterer apparatus, generally designated 65. The dielectric layer 51 substantially comprises Silica ($SiO_2$), but may in an a modification comprise another dielectric material such as Aluminium Oxide ($Al_2O_3$). As can be seen from FIG. 6, the sputterer apparatus 65 includes a chamber 70 which, in use, is substantially filled with an inert gas such as Argon which is preferably provided within the chamber 70 at a pressure of around 2 $\mu$m of Hg. The sputterer 65 also comprises an RF source 75 connected to a cathode 80 and to an anode 85 of the sputterer 65 respectively. A silica target 81 is provided on the cathode 80, while the device body portion 5 (on wafer 82) is provided on the anode 85 of the diode sputterer 65. In use, an Argon plasma (not shown) is generated between the cathode 80 and anode 85 with first and second dark spaces being provided between the Silica target 81 and the Argon plasma and between the Argon plasma and the device body portion 5, respectively.

The step of processing the device body portion 5 so as to create extended defects at least in a portion of the device body portion 5 comprises part of a Quantum Well Intermixing (QWI) process used in the manufacture of the device 40, the QWI process comprising—in a preferred embodiment—an Impurity-Free Vacancy Disordering (IFVD) technique. It has been surprisingly found that by sputtering from the device body portion 5 using the sputterer 65, damage induced extended defects are introduced into the portion 53 of the device body portion 5; the portion 53 in this case comprising part of the cap layer 35. It is believed that the damage in the cap layer 35 prior to annealing (which will hereinafter be described), eg the application of thermal energy by rapid thermal annealing, thereby inhibiting transfer of Gallium from the portion 53 of the cap layer 35 into the further dielectric layer 60.

The dielectric layer 51 is typically between 10 to 1000 nm, and typically 300 nm in thickness. The method of manufacture includes a further step as shown in FIG. 5(f) of depositing further dielectric layer 60 on the surface 52 of device body 5 and on a surface of the dielectric layer 51 prior to annealing. The further dielectric layer 60 is deposited by a technique other than diode sputtering, and preferably by magnetron sputtering, or alternatively, by Plasma Enhanced Chemical Vapour Deposition (PECVD).

The dielectric layer 51 therefore comprises an intermix cap layer, while the further dielectric layer 60 comprises an intermix suppressing cap layer. The intermix suppressing cap layer is used to protect the surface 52 from Arsenic desorption. The method will work without the intermix suppressing cap layer; however the quality of the surface 52 may not be so good.

Figure 5G:
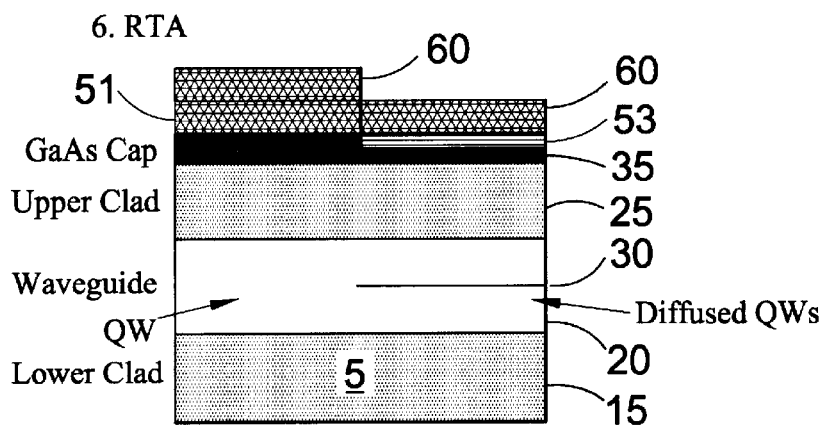

As shown in FIG. 5(g), subsequent to deposition of the further dielectric layer 60, the device body portion including the dielectric layer 51 and further dielectric layer 60 is annealed at an elevated temperature. The annealing stage comprises a rapid thermal annealing stage, the annealing temperature being around 700° C. to 1000° C. for around 0.5 to 5 minutes, and in one implementation, at substantially 800° C. for substantially 1 minute.

Figures 8A, 8B:
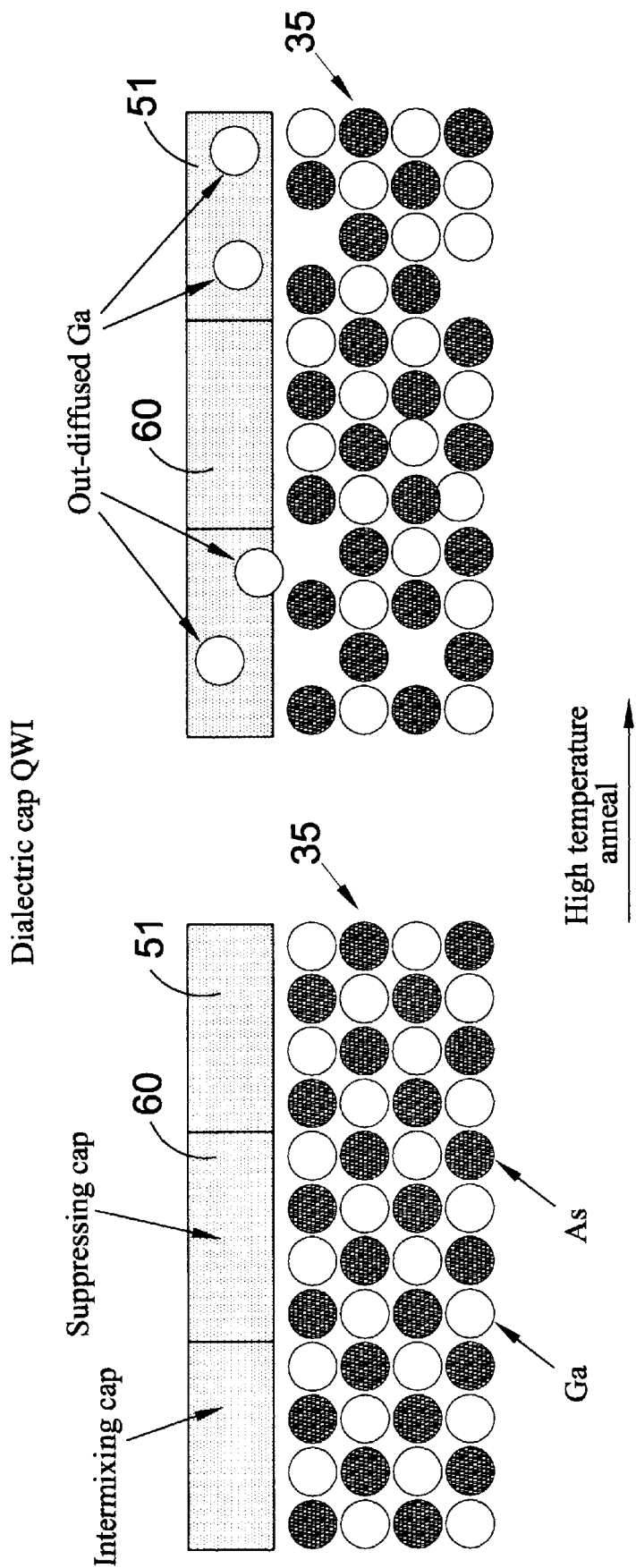
FIGS. 8(a) and (b) more detailed schematic side views of the device body portion of FIGS. 5(a) to (g) before and after an annealing step shown in mn FIG. 5(g)

The action of the annealing step of FIG. 5(g) is illustrated diagrammatically in FIGS. 8(a) and (b). As can be seen from FIGS. 8(a) and (b), the annealing step causes "out diffusion" of Gallium from the cap layer 35 to the intermixing cap, ie dielectric layer 51. However, portions of the cap layer 35 below portion 53 and the suppressing cap, ie further dielectric layer 60, are not subject to Gallium "out-diffusion". The portions of the cap layer 35 which lie within an area of the intermixing cap, ie dielectric cap 51, are subject to out-diffusion of Gallium as shown in FIG. 8(b). The out-diffusion of Gallium leaves vacancies behind which vacancies migrate from the cap layer 35, through the second cladding layer 25, and into the core layer 20, and hence to the Quantum Well structure(s) 30, thereby changing the effective band-gap of the Quantum Well (QW) structure 30, and effectively washing-out the Quantum Wells of the Quantum Well structure 30 below the intermixing cap layer.

It will be appreciated that the intermixing cap, ie dielectric layer 51, is provided within the area of the passive region 50 to be formed in device 40, while the suppressing cap, ie further dielectric layer 60, is provided on the device body portion 5 in areas such as the optically active region 45 to be formed on the device 5, which areas are not to be Quantum Well Intermixed (QWI).

Once the device body portion 5 has been processed to the stage of FIG. 5(g), and annealed, the dielectric layer 51 and further dielectric layer 60 may be removed by conventional methods, eg wet or dry etching.

Figure 9A:
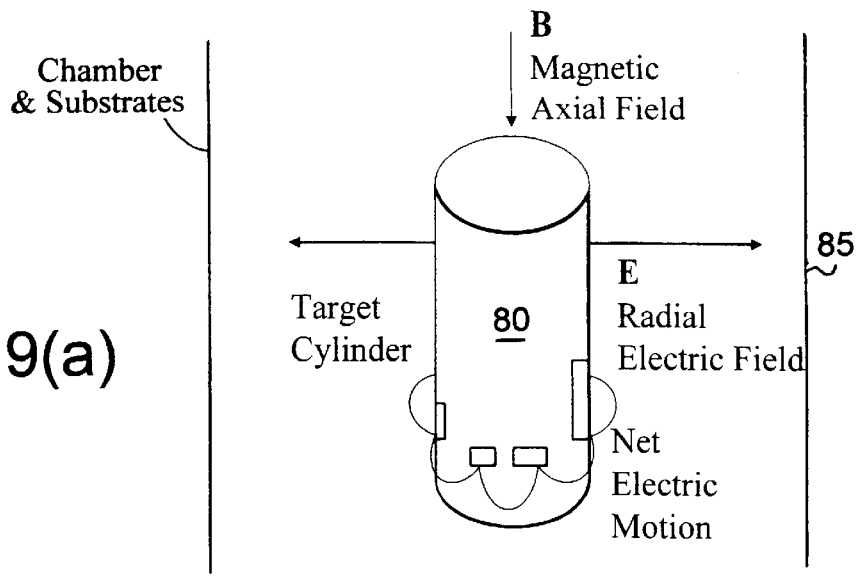
FIGS. 9(a) to (c) schematic representations of various possible configurations of the magnetron sputterer apparatus of FIG. 6.
Figure 9B:
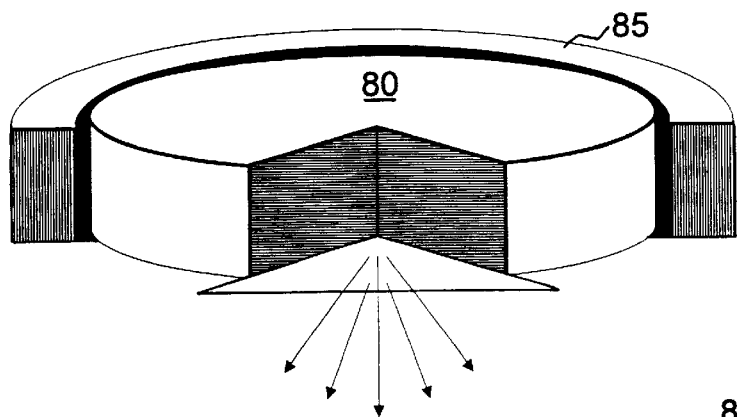
Figure 9C:
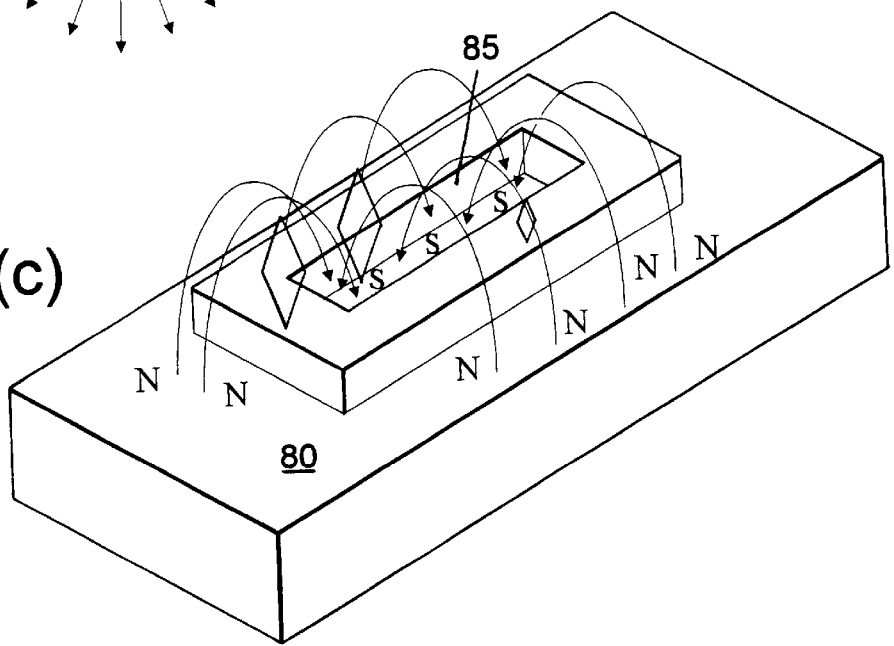

It will be appreciated that in the step of processing the device body portion 5 so as to produce extended defects at least in a portion 53 of the device body portion 5, any magnetically enhanced sputtering apparatus may be employed. Particularly magnetron sputterers such as the magnetron sputterer 6 FIGS. 6 and 7 can be used. In magnetron sputterers it is attempted to trap electrons near the "target" so as to increase their ionising effect. This is achieved with electric and magnetic fields which are generally perpendicular. It will be appreciated that a number of magnetron sputterer configurations are known such as the cylindrical magnetron illustrated in FIG. 9(a), the circular magnetron illustrated in FIG. 9(b), or the planar magnetron illustrated in FIG. 9(c). The various parts of the magnetron sputterer apparatus 65a, b, c of FIGS. 9a, b, c, respectively are identified by the same reference integers as the magnetron apparatus 65 of FIGS. 6 and 7.

It will be appreciated that in the step of FIG. 5(b) the device body portion 5 comprises the substrate 82 of the sputtering apparatus 65 of FIGS. 6 and 7, while the silica target 81 is the target from which sputtering occurs. This is also the case in the deposition stage of the further dielectric layer 60 of FIG. 5(f). However, in the step of FIG. 5(e) the bias voltages are reversed, and the wafer 82 in effect becomes the sputtering target from which sputtering occurs. This so-called "pre-etch" stage introduces the extended defects into the portion 53 of the device body portion 5. Between the step FIG. 5(e) and FIG. 5(f), the bias voltages are again reversed.

EXAMPLE

There now follows an example which illustrates a typical band-gap shift which can be obtained using IFVD in a method of manufacturing an optoelectronic device according to the present invention in a long wavelength aluminium alloy such as Aluminium Gallium Arsenide (AlGaAs), grown on a Gallium Arsenide (GaAs) substrate.

The sputter chamber 70 is configured as follows.

A plate separation of the order of 100 mm between the cathode and the anode is provided. The electrode configuration is a 4 inch circular plate. The gas used in the system is typically Argon but other gases may be used. Also a small amount of Oxygen may be added to the plasma (approximately 10% by volume) to improve the stoichometry when performing dielectric film deposition. The dielectric used for the process is typically $S_1O_2$, but others such as $Al_2O_3$ can be used. The pressure used within the chamber 70 for both the pre-etch and the magnetron silica deposition process is around 2 microns of Hg.

The following Table outlines the resulting shifts for samples with 200 nm of magnetron silica deposited on top of them. One sample had a 5 minute pre-etch at power level of 500 W. The figures in the Table detailing the shift are for anneal 900° C. for 1 minute.

TABLE 1

| Deposition conditions | Shift (nm) |
|---|---|
| Only magnetron Silica | 2 |
| Sputtered-etch then magnetron deposited silica | 45 nm |

Table 1 illustrates that sputtering from the device body portion silica ($SiO_2$) provides an improved intermix suppressing cap.

To process a wafer to produce more than one band gap a film of magnetron silica is deposited on to the wafer. Photolithography techniques are then used to delineate a pattern on top the magnetron silica either wet or dry etching can then be used to transfer the pattern into the magnetron silica.

The sample is then placed into the sputtering apparatus (rig) for pre-etching and a subsequent further magnetron silica deposition.

A rapid thermal anneal is now performed at a suitable temperature (700° C.–1000° C.) for the required period of time (0.5 to 5 min). This enables the point defects generated at the surface in the magnetron silica to propagate through the structure and cause interdiffusion of the elements.

It will be appreciated that the embodiments of the invention hereinbefore described are given by way of example only, and are not meant to limit the scope thereof in any way.

It should be particularly understood that magnetron sputtered silica is suitable for performing the IFVD process in around 980 nm GaAs/AlGaAs material. Furthermore, using a combination of a sputter pre-etch and magnetron sputtering to deposit another silica layer, provides an effective QWI suppression layer.

It is believed that using the pre-etch causes high levels of damage and the occurrence of extended defects in the cap (top layer) layer of the epitaxial wafer. These extended defects effectively trap point defects and stop them from diffusing down to the QW, thus effectively stopping any intermixing of the QW. The damage arises from the bombardment of ions at the sample surface.

A bias sputtering arrangement is used for the process. In this arrangement the substrate can be switched from being the anode/cathode of the system. Initially the electrode the sample is located upon is made positive and the negative ions in the plasma are accelerated to the surface thereof causing a high degree of damage to the cap layer, (ie the extended defects).

Further, it will be appreciated that using effectively the same type of silica for the whole process circumvents a problem of IFVD with dielectric caps, namely mismatch of the expansion of co-efficients thereof. This allows the post anneal quality of the material to be kept to a high quality.

It will further be appreciated that an optical device according to the present invention may include a waveguide such as a ridge or buried heterostructure or indeed any other suitable waveguide.

It will also be appreciated that the Quantum Well Intermixed (QWI) regions may comprise optically active device (s).

Further, it will be appreciated that sequential processing including using several RF powers may be used to provide a device with several different QWI band-gaps.

What is claimed is:

1. A method of manufacturing an optical device, a device body portion from which the device is to be made including a Quantum Well (QW) structure, the method including the steps of:
   processing the device body portion so as to create extended defects at least in a portion of the device body portion; and
   responsive to said step of processing, reducing or inhibiting the effects of a subsequent thermal anneal step that otherwise generates a band gap shift in the portion of the device body portion.

2. A method of manufacturing an optical device as claimed in claim 1, wherein said step of processing the device body portion comprises sputtering from the device body portion.

3. A method of manufacturing an optical device as claimed in claim 2, wherein in said step of sputtering from the device body portion a magnetic field is provided around the device body portion.

4. A method of manufacturing an optical device as claimed in claim 2, wherein in said step of sputtering from the device body portion, a magnetron sputterer is used.

5. A method of manufacturing an optical device as claimed in claim 4, wherein in said step of sputtering from the device body portion a reverse electrical bias is applied across an electrode upon which the device body portion is provided so as to provide a pre-etch of the device body portion.

6. A method of manufacturing an optical device as claimed in claim 1, wherein the method includes the preceding step of depositing a dielectric layer on at least one other portion of the device body portion, which dielectric layer may therefore act as a mask in defining the at least one portion.

7. A method of manufacturing an optical device as claimed in claim 6, wherein the method also includes the subsequent step of depositing a further dielectric layer on the dielectric layer and/or on the at least one portion of the device body portion.

8. A method of manufacturing an optical device as claimed in claim 7, wherein the dielectric layer and/or the further dielectric layer are deposited by use of a magnetron sputterer.

9. A method of manufacturing an optical device as claimed in claim 7, wherein the dielectric layer and/or the further dielectric layer are deposited by a deposition technique other than by use of a diode sputterer.

10. A method of manufacturing an optical device as claimed in claim 7, wherein the dielectric layer and the further dielectric layer substantially comprise Silica ($SiO_2$) or Aluminum Oxide ($Al_2O_3$).

11. A method of manufacturing an optical device as claimed in claim 4, wherein the sputterer includes a chamber which is substantially filled with an inert gas.

12. A method of manufacturing an optical device as claimed in claim 7, wherein the step of depositing the dielectric layer comprises part of a Quantum Well Intermixing (QWI) process used in manufacture of the device.

13. A method of manufacturing an optical device as claimed in claim 7, wherein the QWI process comprises Impurity-Free Vacancy Disordering (IFVD).

14. A method of manufacturing an optical device as claimed in claim 6, wherein the method of manufacture also includes the subsequent step of annealing the device body portion including the dielectric layer at an elevated temperature.

15. A method of manufacturing an optical device as claimed in claim 1, wherein the method of manufacture also includes the preceding steps of:

providing a substrate;

growing on the substrate:

a first optical cladding layer; a core guiding layer including a Quantum Well (QW) structure; and a second optical cladding layer.

16. A method of manufacturing an optical device as claimed in claim 15, wherein the first optical cladding layer, core guiding layer, and second optical cladding layer are grown by a growth technique selected from Molecular Beam Epitaxy (MBE) and Metal Organic Chemical Vapour Deposition (MOCVD).

17. A method of manufacturing an optical device as claimed in claim 7, wherein the method comprises the step of:

depositing the dielectric layer on a surface of the device body portion;

defining a pattern in photoresist on a surface of the dielectric layer and lifting off at least part of the photoresist so as to provide the dielectric layer on said at least one other portion of the device body portion.

18. A method of manufacturing an optical device as claimed in claim 17, wherein the method also includes the step of:

depositing the further dielectric layer on a portion of the surface of the device body and on a surface of the dielectric layer prior to annealing.

19. A method of manufacturing an optical device as claimed in claim 18, wherein the dielectric layer comprises an intermixing cap; while the at least one portion of the device body portion and/or the further dielectric layer comprises an intermixing suppressing cap.

20. A method of manufacturing an optical device as claimed in claim 7, wherein the thickness of the dielectric layer and the further dielectric layer is around 10 to a few hundred nm.

21. A method of manufacturing an optical device as claimed in claim 14, wherein the annealing step occurs at a temperature of around 700° C. to 1000° C. for around 0.5 to 5 minutes.

22. A method of manufacturing an optical device as claimed in claim 2, wherein the step of sputtering from the device body portion is carried out using a magnetron sputterer.

* * * * *